(12) United States Patent
Verbist (10) Patent No.: US 7,443,025 B2
(45) Date of Patent: Oct. 28, 2008

(54) THERMALLY IMPROVED PLACEMENT OF POWER-DISSIPATING COMPONENTS ONTO A CIRCUIT BOARD

(75) Inventor: Rudi Verbist, Schriek (BE)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/146,234

(22) Filed: Jun. 7, 2005

(65) Prior Publication Data

US 2005/0270749 A1 Dec. 8, 2005

Related U.S. Application Data

(60) Provisional application No. 60/577,213, filed on Jun. 7, 2004.

(51) Int. Cl.
*H01L 23/34* (2006.01)

(52) U.S. Cl. ........................ 257/712; 257/713; 257/706; 257/707; 257/724; 257/777; 257/778; 257/E23.051; 257/E23.085; 257/685

(58) Field of Classification Search ................. 257/685, 257/686, 777, 778, E23.085, E23.169, E23.178, 257/706, 707, 713, 723, 724, E23.051, E23.081, 257/712; 361/704; 324/755

See application file for complete search history.

(56) References Cited

U.S. PATENT DOCUMENTS

| 5,723,907 | A | * | 3/1998 | Akram | 257/723 |
| 5,831,890 | A | * | 11/1998 | Selna et al. | 365/51 |
| 5,973,923 | A | * | 10/1999 | Jitaru | 361/704 |
| 6,127,833 | A | * | 10/2000 | Wu et al. | 324/755 |

* cited by examiner

*Primary Examiner*—Minh-Loan Tran
*Assistant Examiner*—Benjamin Tzu-Hung Liu
(74) *Attorney, Agent, or Firm*—Sterne, Kessler, Goldstein & Fox PLLC (57) ABSTRACT

The invention refers to an electronic system, comprising several power-dissipating components, and a circuit board, wherein said power-dissipating components are mounted both to a top side and a bottom side of said circuit board. Further, the invention refers to method for mounting power-dissipating components onto a circuit board, comprising the steps of (a) determining the thermal behavior of said power-dissipating components; and (b) determining, in accordance thereto, the placement of said power-dissipating components on both a top side and a bottom side of said circuit board.

15 Claims, 5 Drawing Sheets

THERMALLY IMPROVED PLACEMENT OF POWER-DISSIPATING COMPONENTS ONTO A CIRCUIT BOARD

CROSS REFERENCE TO RELATED APPLICATIONS

This application claims benefit to U.S. Provisional Application No. 60/577,213 filed on Jun. 7, 2004, and titled "Thermally Improved Placement of Electronic Components" which is incorporated by reference herein in its entirety.

BACKGROUND OF THE INVENTION

1. Field of the Invention

The invention relates to an electronic system, comprising several power-dissipating components, in particular packages containing integrated circuits, and to a method for mounting these components onto a circuit board.

2. Background Art

Circuit boards typically comprise several power-dissipating components (e.g., integrated circuits like processing units, controllers etc., and/or resistors and so on) mounted thereon. Especially integrated circuits (e.g., analog and/or digital circuits, memory devices (PLAs, PALs, ROMs, RAMs, etc.) in the form of silicon chips) can be loaded into and electrically contacted with special housings ("packages"), e.g. made of ceramic, plastic, composite materials and so forth, that may be specifically designed to, amongst other functions, alter and improve the dissipation/spreading of power (typically in the form of heat) of the integrated circuit.

The contact between the integrated circuit(s) and the housing(s) can be achieved by various known means, e.g. soldering, bonding, flip-chip techniques and so on. External contacts of the package (pins, pads, balls etc.) serve to electrically connect one or a plurality of the packages to a corresponding module, in particular, a printed circuit board (PCB). For this purpose, the respective external contacts might e.g. be plugged in or on, and/or soldered to the circuit board. For example, pins might be mounted onto the surface of the board (e.g., in the case of SMD-packages "SMD=surface mounted device"), or might be put into respective connection holes provided in the board (and thereafter, might be soldered).

Many power-dissipating components—and most packages—show an asymmetry in the direction in which they dissipated their power as heat. In particular, we can consider the power dissipated via the top of the package ("PT"), and the power dissipated via the bottom of the package ("PB"). Heat dissipation and power dissipation in this context refer to essentially the same physical effect and could be used interchangeably. For example, some packages are equipped with a built-in heatpad on the bottom side of the package, which results in a higher power dissipation through their bottom than through their top portion, i.e. PB>PT. Other packages are equipped with a built-in heatpad or heatspreader on the top side of the package, which may result in a higher power dissipation through their top side than through their bottom side, i.e. PB<PT.

If, for instance, a package with PB>>PT is soldered on the top side of a printed circuit board (PCB), most of the heat produced by the integrated circuit provided in the package will flow into the printed circuit board (PCB). Further (particularly, if non-thermal vias are used), most of the heat will then flow to the bottom side of the printed circuit board (PCB) from where it will flow away by "natural" and/or "forced" convection (e.g., convection supported by fans).

In the case of a relatively high number of identical packages as just described being soldered to the top side of a printed circuit board (PCB), the total heat flow to the bottom side might become substantial.

Hence, the provision of heatsinks on the printed circuit board or the use of cooling fans or other cooling methods might become necessary. Still, overheating of the printed circuit board (PCB) and /or the integrated circuits might occur, leading e.g. to mechanical tensions (and even, the breaking up or tearing apart of a soldering connection between a pin, and the PCB), and/or the destruction of an integrated circuit, etc., etc. With the ever increasing complexity and performance of integrated circuits, as well as the increasing component density on PCBs, more and more power/heat per PCB surface area is produced during their operation, increasing the problems.

BRIEF SUMMARY OF THE INVENTION

The invention is aimed at making available a novel electronic system, comprising several power-dissipating components, in particular packages containing integrated circuits, and a novel method for mounting power-dissipating components, in particular integrated circuits, onto a circuit board.

An electronic system is provided, comprising several power-dissipating components and a circuit board. According to an embodiment of the invention, the power-dissipating components are mounted both to a top side, and a bottom side of the circuit board.

Further, a method for mounting power-dissipating components onto a circuit board is provided. According to an embodiment of the invention, the method comprises the steps:

determining the thermal behavior of the power-dissipating components; and determining, in accordance thereto, the placement of the power-dissipating components on the circuit board.

In one preferred embodiment of the electronic system, at least one of said power-dissipating components may comprise a package containing an electronic device. Other power-dissipating components may not have a package, e.g. bare resistors and such.

In another preferred embodiment of the electronic system, the electronic device included in the package is an integrated circuit, e.g. a silicon chip working as a CPU, Controller, memory device etc. But also other devices may be housed in a package, e.g. arrays of resistors and/or capacitors etc.

In another preferred embodiment of the electronic system, all (substantially) power-dissipating components show a similar thermal behavior, preferably regardless of other parameters like size, material, electrical connection, clock rate, and so forth. This thermal characteristic can for example be achieved by choosing a suitable package for a certain device that guides/channels the heat as required. For example, two different integrated circuits with a different power/heat dissipating characteristic get different packages that align the patterns of the respective heat flows.

In another preferred embodiment of the electronic system, the power dissipated via the bottom ('PB') of said component is lower than the power dissipated via the top ('PT') of said component, i.e. PB<PT. This can be achieved by, for example, selecting materials at the top of a package that conduct heat better than materials at the bottom of the package, e.g. metals like copper, aluminum etc. at the top forming a heat-spreader and e.g. plastics, polymer etc. at the bottom.

Alternatively, in another preferred embodiment of the electronic system, the power dissipated via the top of said component is lower than the power dissipated via the bottom of said component. This can be achieved by, for example, selecting materials at the bottom of a package (metals etc.) that conduct heat better than materials at the top of the package (plastics etc.).

To even more effectively use the invention, in another preferred embodiment, the electronic system comprises at least four power-dissipating components, preferably about the same number—especially exactly the same number—on top of the printed circuit as at the bottom of the printed circuit.

In even another preferred embodiment, the electronic system comprises power-dissipating components, especially but not limited thereof packages containing integrated circuits, that are mounted in the form of rows and/or columns and/or diagonals to both said top side and said bottom side of said circuit board. The rows and/or columns and/or diagonals do not have to be mounted alternating between top and bottom of the printed circuit board but can have different configurations, e.g. one row etc. on top, two rows at the bottom, three rows on top, one row at the bottom etc.

Then, preferably, the rows or columns or diagonals of said power-dissipating components mounted to the top side are offset with respect to the rows or columns of the power-dissipating components mounted to the bottom side.

In another preferred embodiment of the electronic system—when viewed from above—the power-dissipating components mounted to the top side of the circuit board and the power-dissipating components mounted to the bottom side of the circuit board are spaced, preferably but not restricted to equal distances between them, especially when relating to distances between rows, columns, and/or diagonals.

In another preferred embodiment of the method for mounting power-dissipating components onto a circuit board, at least one of said power-dissipating components comprises a package containing an electronic device, preferably an electronic device in form of an integrated circuit.

In another preferred embodiment of the method, the determining of the thermal behavior of said power-dissipating components comprises the step of determining the power dissipated via the bottom of said power-dissipating components.

In another preferred embodiment of the method, the determining of the thermal behavior of said power-dissipating components comprises: determining the power dissipated via the top of said power-dissipating components.

In another preferred embodiment of the method, the power-dissipating components are mounted in the form of rows and/or columns and/or diagonals to both said top side and said bottom side of said circuit board.

Then, in a further preferred embodiment of the method, the rows or columns or diagonals mounted to said top side are offset with respect to said rows or columns or diagonals mounted to said bottom side of said circuit board.

In another preferred embodiment of the method, the offset is determined depending on a thermal behavior of said power-dissipating components.

These and further embodiments and configurations can be combined, if necessary. Also, it is within the scope of the invention to place only some of the power-dissipating components according to the invention while others are placed according to the state of the art, e.g. at different sections of the printed circuit board. Also, one may only consider substantially power-dissipating components, i.e. components that radiate more heat than a certain threshold value.

BRIEF DESCRIPTION OF THE DRAWINGS/FIGURES

The above and other features, aspects and advantages of the present invention will be more fully understood when considered with respect to the following detailed description, appended claims and accompanying drawings, wherein:

DETAILED DESCRIPTION OF THE INVENTION

Figure 1:
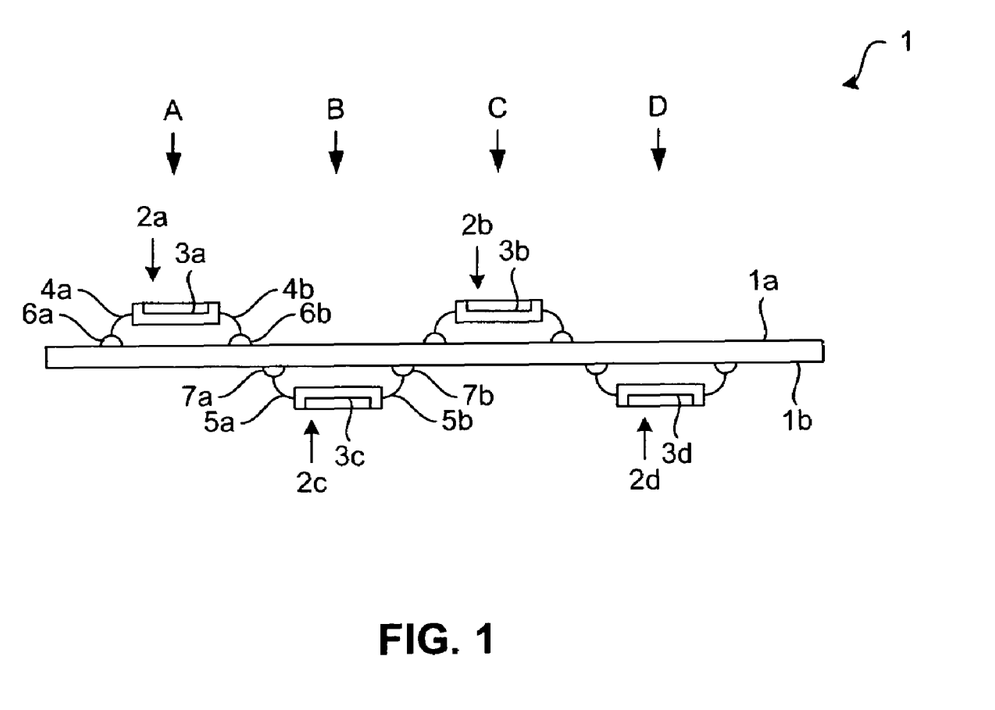
FIG. 1 is a simplified, schematic side view of a section of a circuit board and several packages mounted thereto, according to a first embodiment of the invention.

FIG. 1 shows a side view of a section of a printed circuit board (PCB) 1, as well as several power-dissipating components in the form of packages 2a, 2b, 2c, 2d containing devices in the form of integrated circuits 3a, 3b, 3c, 3d, according to a first embodiment of the invention. The integrated circuits can be mounted onto the packages 2a-2d by several known techniques like soldering, flip-chiping and so on. The packages 2a-2d can also or exclusively contain other heat-dissipating electrical or electronic devices like (arrays of) resistors and/or capacitors etc. and are not limited to a certain type of heat-dissipating device. The packages/housings 2a-2d are formed of suitable material like ceramics, plastics, composites etc. or a mixture thereof.

The integrated circuits 3a-3d may be respective analog and/or digital circuits, and/or memory devices (PLAs, PALs, ROMs, RAMs, etc.) and so on.

Thereby, respective contacts of the integrated circuits 3a-3d are—e.g. by means of appropriate bonding wires—connected with appropriate external contacts 4a, 4b, 5a, 5b (e.g. "pins") of the respective package 2a-2d. In turn, the pins 4a, 4b, 5a, 5b serve to electrically connect the packages 2a-2d with the printed circuit board (PCB) 1 (in particular, with respective electric lines provided on and/or in the printed circuit board 1 (not shown)). For this purpose, the respective pins 4a, 4b, 5a, 5b might e.g. be plugged in or on, and/or soldered to the printed circuit board 1 (see e.g. the exemplifying soldering connections 6a, 6b, 7a, 7c between the pins 4a, 4b, 5a, 5b, and the board 1 shown in FIG. 1).

Figure 2:
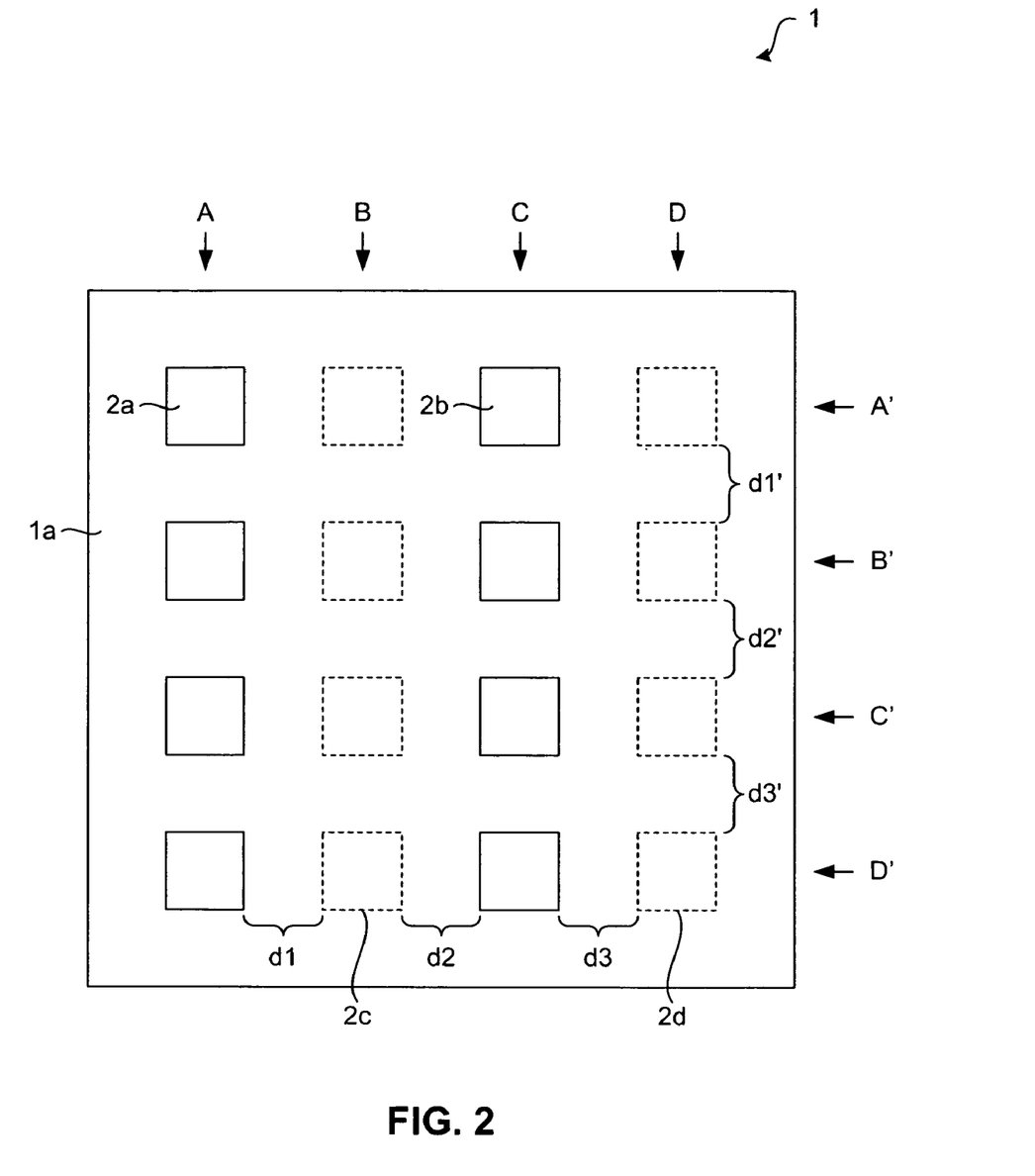
FIG. 2 is a simplified, schematic top view of the circuit board section shown in FIG. 1, and the packages mounted thereto.

According to FIGS. 1 and 2, a relatively high number of packages 2a-2d/integrated circuits 3a-3d (often, colloquially, the terms 'packages', 'integrated circuits', and 'chips' are used without difference) might be mounted to one and the same printed circuit board 1 (e.g., more than three, five, eight, twelve or even more packages 2a-2d).

In the Figures, only a certain number of packages 2a-2d and/or other heat-dissipating components can be shown, but these describe a way to generally place some or all of them on the circuit board 1, as will be described in further detail below.

Figure 3A:
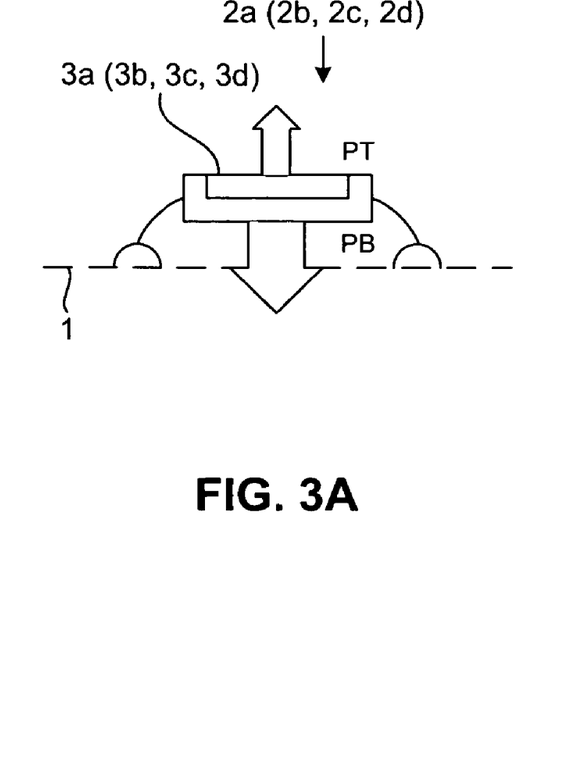
FIGS. 3a and 3b are a simplified, schematic side views of a package, illustrating its asymmetric thermal behavior.
Figure 3B:
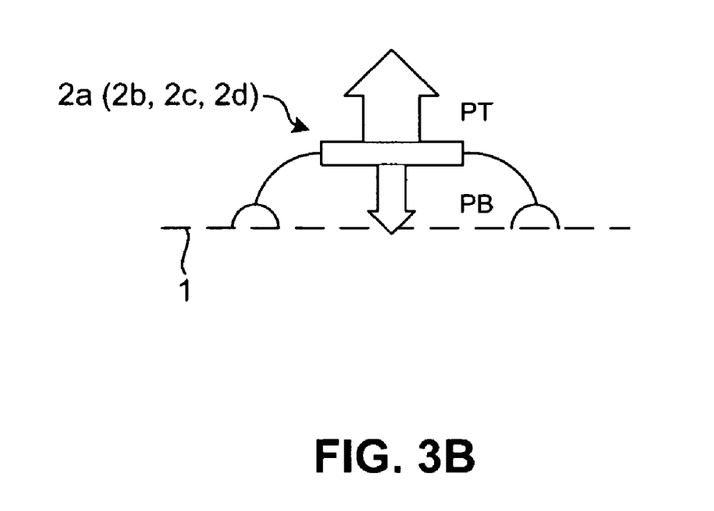

As illustrated in FIGS. 3a and 3b, the packages 2a-2d into which the above integrated circuits 3a-3d (or other power-dissipating devices) are mounted may show an asymmetric thermal behavior. In the embodiments shown, all packages 2a-2d, in particular if mounted to the circuit board 1, may show a corresponding, asymmetric behavior—even though they might differ in other aspects (e.g. size, number of pins, package material, etc.).

In particular, according to the specific example shown in FIG. 3a, the power/heat dissipated via the top ('PT') of the packages 2a-2d may be lower than the power dissipated via the bottom ('PB') (i.e., PB>PT, designated by the arrows of different size). For example, the respective packages 2a-2d might be equipped with a built-in heatpad on the bottom, which results in a relatively low thermal resistance between the integrated circuits 3a-3d and the bottom portion of the packages 2a-2d, and further in a relatively good heat dissipation into the environment, typically 'naturally vented' or 'ventilated' air.

FIG. 3b shows the case wherein the power/heat dissipated via the top ('PT') of the packages 2a-2d is higher than the power dissipated via the bottom ('PB') (i.e., PT>PB).

Whether for the particular packages 2a-2d PT>PB or PB>PT is valid, might e.g. be taken from the respective specification(s) of the packages 2a-2d or, alternatively, might be measured using respective thermal resistance/heat dissipation measuring methods well-known in the art.

Some or all of the integrated circuits 3a-3d mounted into the above packages 3a-3d, and shown in FIGS. 1 and 2 (and, potentially, further integrated circuits not shown herein, but also mounted to the circuit board 1 shown in FIG. 1 and 2) might be built similarly or essentially the same, and/or might e.g. perform the same or essentially the same function. For instance, some or all of the shown integrated circuits 3a-3d might perform DSL (Digital Subscriber Line) functions, e.g. DSL line driver/amplifier functions, etc. (for which purpose each of the shown integrated circuits 3a-3d might be allocated to, and/or connected with a different twisted pair telephone line). The printed circuit board 1 might then e.g. be a DSL line card.

Alternatively, the integrated circuits 3a-3d shown in FIG. 1 and 2 (or at least some of them) might also be substantially different (e.g., might perform different functions, and/or might be built differently).

Referring again to FIGS. 1 and 2, it can be seen that according to the specific embodiment, some of the packages 2a,2b are mounted to the top side 1a of the printed circuit board 1, and some other of the packages 2c,2d are mounted to the bottom side 1b of the printed circuit board 1.

In particular, the packages 2a-2d are arranged in the form of columns A, B, C, D (or, alternatively, e.g. in the form of rows, etc.) on the respective sides 1a, 1b of the printed circuit board 1 (each of the columns A, B, C, D comprising several packages placed—in the illustration according to FIG. 2—"above" or "below" each other).

In particular, a first column A of packages 2a might be mounted to the top side 1a of the printed circuit board 1, a next, adjacent column B of packages 2c (see dashed lines in FIG. 2) might be mounted to the bottom side 1b of the printed circuit board 1, a further column C of packages 2b adjacent to the package column B might again be mounted to the top side 1a of the printed circuit board 1, and an additional column D of packages 2d (see dashed lines in FIG. 2) adjacent to the package column C might be mounted to the bottom side 1b of the printed circuit board 1, and so on. (hence, the columns A, B, C, D of packages are—in an alternating way—either mounted to the top side 1a, or the bottom side 1b of the printed circuit board 1).

As can be seen in FIG. 2, the columns A, B, C, D of packages 2a-2d might be essentially parallel.

Further, several packages allocated to different, adjacent columns A, B, C, D might be mounted—in the illustration according to FIG. 2—"right" or "left" of each other in such a way as to form essentially parallel rows A', B', C', D' of packages (each of the rows A', B', C', D' comprising packages—alternatingly—mounted to the top side 1a, or the bottom side 1b of the printed circuit board 1).

In another embodiment (not shown), the rows and columns are still essentially parallel to each other but not necessarily alternatingly placed top/bottom side. Rather, it is e.g. the case that x1 consecutive rows, or columns are placed on top side of the printed circuit board and then x2 rows or columns are placed on the bottom side, then x3 consecutive rows or columns are placed on top side, etc. etc. where x1,x2,x3>=1.

In addition, as is shown in FIG. 2,—viewed from the top of the circuit board 1—, the outer limit of a respective column A (or, the outer limit of the respective packages 2a comprised therein) might—in a vertical direction through the printed circuit board—be spaced apart from the nearest outer limit of an adjacent column B (or, the outer limit of the respective packages 3c comprised therein, and mounted to the opposite side 1b of the printed circuit board 1, than the packages 3a comprised in the adjacent column A).

In other words, neighboring columns, e.g. (A,B) or (B,C) or (C,D) etc., or rows, e.g. (A',B') or (B',C') or (C',D') etc. may be spaced at a certain distance d1, d2, d3 (and/or d1',d2',d3', resp.) between each other, i.e. between respective—nearest—outer limits of adjacent columns (and/or rows, resp.), e.g. (A,B) (or, more precisely, the packages 2a, 2c comprised therein).

The respective distances d1, d2, d3 may be the same for all columns A-D or rows A'-D' but can also differ, e.g. depending on the amount of heat dissipated from the packages 2a-2d. In detail,—depending on the thermal behavior of the packages 2a-2d—the distances might be chosen differently from what is shown in FIG. 2, e.g. bigger or smaller, e.g. might be zero, or, e.g.—viewed from the top of the circuit board 1—there might be an overlap between adjacent columns (comprising packages mounted on opposite sides of the circuit board) (and thus, also,—viewed from the top of the circuit board 1—there might be an overlap between respective packages belonging to different, adjacent columns (and mounted to opposite sides of the printed circuit board)).

If the packages 2a-2d show PB>PT, most of the heat produced by the integrated circuits 3a-3d provided in the packages 2a-2d will flow from the packages 2a-2d (either in a downward, or an upward direction) into the printed circuit board 1.

Further, as far as the packages 2a, 2b mounted to the top side 1a of the printed circuit board 1 are concerned, a substantial part of the heat will then flow further downward to the bottom side 1b of the printed circuit board 1 (in particular, the portion of the bottom side 1b opposite the respective package 2a, 2b).

In addition, in contrast thereto, as far as the packages 2c, 2d mounted to the bottom side 1b of the printed circuit board 1 are concerned, a substantial part of the heat will flow (further upward) to the top side 1a of the printed circuit board 1 (in particular, the portion of the top side 1a opposite the respective package 2c, 2d).

From the top and/or the bottom side 1a, 1b, the heat might flow away by "natural" convection (or, alternatively, as well e.g. by "forced" convection (in this—alternative—embodiment one or several fans are provided close to the top, and/or the bottom side 1b of the printed circuit board 1)).

As the packages 2a-2d are placed both on the top side 1a, and the bottom side 1b of the printed circuit board 1, and due to the specific (symmetric) placement of the packages 2a-2d—chosen in accordance with the thermal behavior of the packages 2a-2d—, a better thermal profile might be created than in the art.

Hence, the provision of heatsinks and/or thermal vias on the printed circuit board 1 might become superfluous (and/or the provision of one or several of the above fans).

Figure 4:
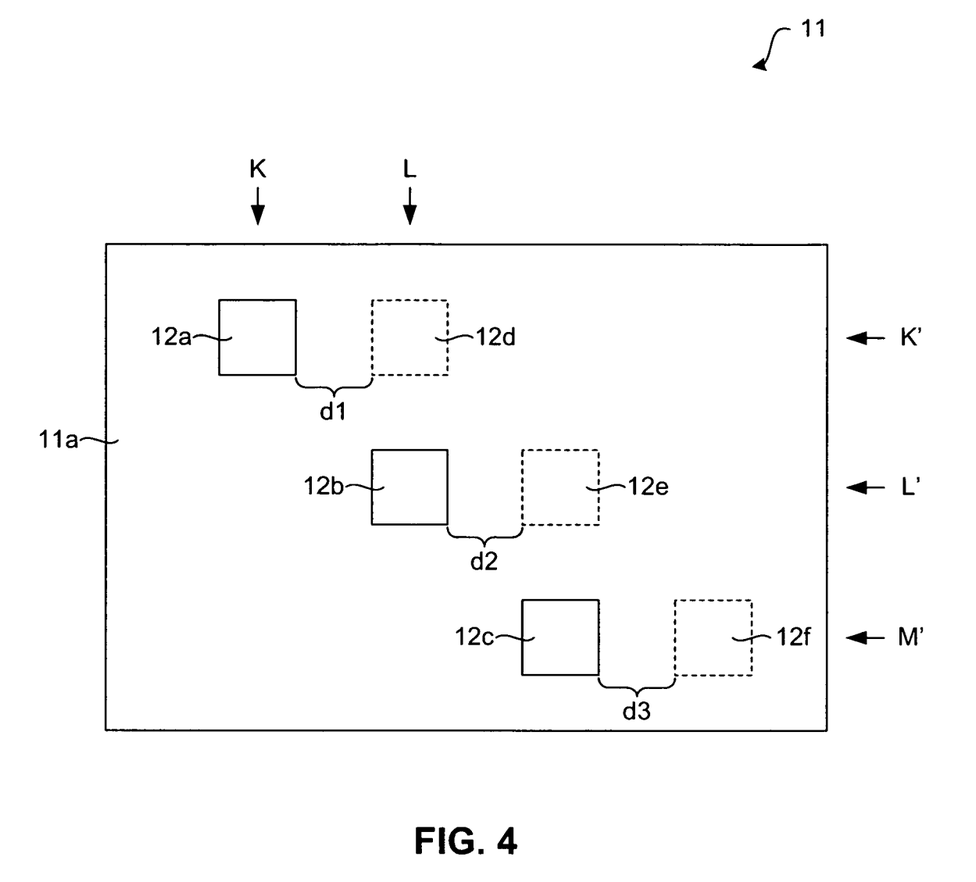
FIG. 4 is a simplified, schematic top view of a section of a circuit board, and packages mounted thereto, shown for illustrative purposes only.

FIG. 4 shows a section of a printed circuit board (PCB) 11, as well as several packages 12a, 12b, 12c, 12d, 12e, 12f mounted thereto, viewed from the top, and shown for illustrative purposes only.

Into the packages 12a-12f may be mounted integrated circuits (not shown) or other power/heat-dissipating devices like resistors, capacitors, power-transistors, transformers and so on. Electrical contacts (not shown) serve to electrically connect the integrated circuits with the printed circuit board (PCB) 11 (in particular, with respective electric lines provided on and/or in the printed circuit board 11 (not shown)). For this purpose, the respective pins might e.g. be plugged in or on, and/or soldered or flip-chipped etc. to the printed circuit board 11.

As may be seen in FIG. 4, a relatively high number of packages 12a-12f/integrated circuits may be mounted to one and the same printed circuit board 11. Here, six packages 12a-12f are shown, but this is for the clarity of the description only; the number of packages can start at two and is not limited. FIG. 4 shows the general arrangement for some or all of the mounted packages, i.e. preferably at least some of them mounted to the circuit board 11 in a corresponding way, as will be described with respect to the packages 12a-12f in further detail below.

The packages 12a-12f show an asymmetric thermal behavior (in this particular case, and as will described in further detail below, all packages 12a-12f show a corresponding asymmetric behavior—even though they might differ in other aspects (e.g. size, number of pins, package material, etc.)).

In particular, according to the specific example shown in FIG. 4, for all the packages 12a-12f shown in this Figure, the power dissipated via the bottom is higher than the power dissipated via the top (i.e., PB>PT). For example, the respective packages 12a-12f might be equipped with a built-in heat-pad on the bottom, which results in a relatively low thermal resistance junction-to-bottom and thus to a high PB. Hence, more heat produced during the operation of the integrated circuits is dissipated to the bottom of the packages 12a-12f than to the top thereof.

The amount of PB, and PT, resp. and/or the power dissipation characteristics might e.g. be taken from the respective specification(s) of the packages 12a-12f or, alternatively, might be measured using respective thermal resistance/heat dissipation measuring methods well-known in the art.

Some or all of the integrated circuits mounted into the above packages 12a-12f, and shown in FIG. 4 (and, potentially, further integrated circuits not shown herein, but also mounted to the circuit board 11 shown in FIG. 4) might be built similarly or essentially the same, and/or might e.g. perform the same or essentially the same function. For instance, some or all of these integrated circuits might perform DSL (Digital Subscriber Line) functions, e.g. DSL line driver/amplifier functions, etc. (for which purpose each of the integrated circuits might be allocated to, and/or connected with a different twisted pair telephone line).

The printed circuit board 11 might then e.g. be a DSL line card.

Alternatively, the above integrated circuits (or at least some of them) might also be substantially different (e.g., might perform different functions, and/or might be built differently).

As is shown in FIG. 4, some of the packages (here: e.g. the packages 12a, 12b, 12c) are mounted to the top side 11a of the printed circuit board 11, and some other of the packages (here: e.g. the packages 12d, 12e, 12f (see dashed lines in FIG. 4)) are mounted to the bottom side of the printed circuit board 11.

In particular, both the packages 12a, 12b, 12c on the top side 11a of the board, and the packages 12d, 12e, 12f on the bottom side of the board are arranged in the form of diagonals K, L (the first diagonal K comprising only packages 12a, 12b, 12c placed on the top side 11a of the board 11, and the second diagonal L comprising only packages 12d, 12e, 12f placed on the bottom side of the board 11).

The board 11 might comprise further diagonals of packages (not shown) (whereby the diagonals K, L of packages, and the further diagonals of packages are—in an alternating way—either mounted to the top side 11a, or the bottom side of the printed circuit board 11).

It is also possible (not shown) to place alternating diagonals in "X"-form, i.e. a top side-mounted diagonal and a bottom side mounted diagonal being placed at an angle to each other, e.g. the angle being 90°. This can be done for example with four packages, of which two are forming a top-side mounted diagonal, and the other two are forming a bottom-side mounted diagonal that is placed at 90° with respect to the top-side mounted diagonal, if viewed from above. Of course, also other angles and/or numbers of packages—or other heat-dissipating components—are possible.

As can be seen in FIG. 4, the (first) diagonal K of packages might be essential parallel to the (second) diagonal L of packages, etc.

In addition, several packages allocated to different, adjacent diagonals K, L might be mounted—in the illustration according to FIG. 4—"right" or "left" of each other in such a way as to form essentially parallel rows K', L', M' of packages (each row K', L', M' comprising packages—alternatingly—mounted to the top side 11a, or the bottom side of the printed circuit board 11).

Further, as is shown in FIG. 4,—viewed from the top of the board 11—the outer limit of respective packages 12a, 12b, 12c comprised in the first diagonal K might—in a vertical direction through the printed circuit board 11—be spaced apart from the nearest outer limit of respective packages 12d, 12e, 12f comprised in the second (or further) diagonal(s) L.

In other words, there might be a certain distance d1, d2, d3 between respective—nearest—outer limits of adjacent packages belonging to different diagonals K, L, i.e. the packages of certain diagonals may be spaced at certain distances d1, d2, d3 regarding the packages of neighboring diagonals.

As, as mentioned above, the packages 12a-12f shown in FIG. 4 dissipate more power via their bottom than their top, i.e. PB>PT, most of the heat produced by the integrated circuits provided in the packages 12a-12f will flow (in an upward, or downward direction) from the packages 12a-12f into the printed circuit board 11.

Further, as far as the packages 12a, 12b, 12c mounted to the top side 11a of the printed circuit board 11 are concerned, a substantial part of the heat will then flow (further downward) to the bottom side the printed circuit board 11 (in particular, the portion of the bottom side opposite the respective package 12a, 12b, 12c).

In addition, in contrast thereto, as far as the packages 12d, 12e, 12f mounted to the bottom side of the printed circuit board 11 are concerned, a substantial part of the heat will flow (further upward) to the top side 11a of the printed circuit board 11 (in particular, the portion of the top side 11a opposite the respective package 12d, 12e, 12f).

From the top and or the bottom side, the heat might flow away by "natural" convection (or, alternatively, as well e.g. by "forced" convection (in this—alternative—example one or several fans are provided close to the top, and/or the bottom side 1b of the printed circuit board 11).

As the packages 12a-12f are placed both on the top side 11a and the bottom side of the printed circuit board 11, and due to the specific (symmetric) placement of the packages 12a-12f, a better thermal profile might be created than in the art.

If (e.g. for the packages 2a-2d, 12a-12f/integrated circuits 3a-3d shown in FIGS. 1, 2, and/or 4) instead of what was said above it is determined that PT>PB—or that PB generally speaking is relatively low (i.e. more heat produced during the operation of the integrated circuits is dissipated at the top of the packages, than at the bottom thereof, or generally speaking quite little heat is dissipated at the bottom of the packages), preferably, a different placement of the packages might be chosen, than those shown in FIGS. 1, 2, and/or 4.

For instance, as shown in FIG. 5, again, respective packages 22a, 22b, 22c, 22d might be mounted to both a top side 21a, and a bottom side 21b of a respective circuit board 21 (e.g. in the forms of columns/rows or diagonals, e.g. corresponding to what is shown e.g. in FIGS. 2 and 4).

Figure 5:
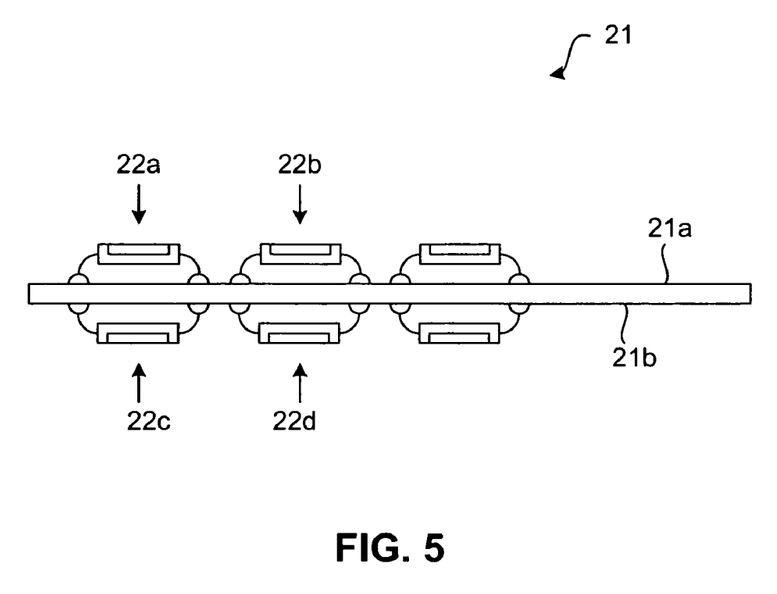
FIG. 5 is a simplified, schematic side view of a section of a circuit board and several packages mounted thereto, shown for illustrative purposes only.

However, as only little heat is dissipated at the bottom of the packages 22a-22d, some or all of the packages 22a, 22b on the top side 21a of the circuit board 21 might be mounted directly opposite to respective packages 22c, 22d mounted to the bottom side 21b of the circuit board.

Figure 6:
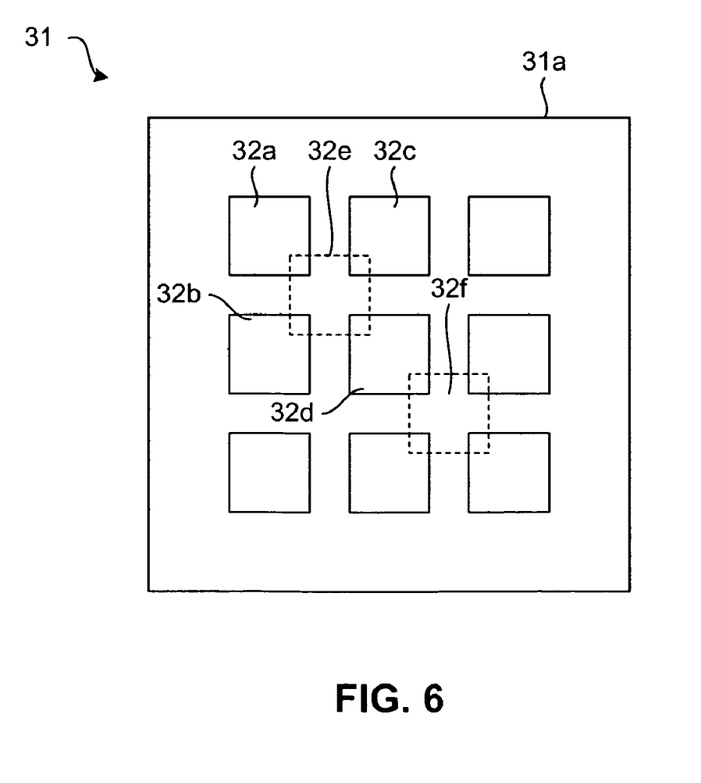
FIG. 6 is a simplified, schematic top view of a section of a circuit board, and packages mounted thereto, shown for illustrative purposes only.

Alternatively, as e.g. shown in FIG. 6, respective packages 32a, 32b, 32c, 32d, 32e, 32f (again e.g. PT>PB) might be mounted—e.g. in the forms of columns/rows or diagonals, e.g. corresponding to what is shown e.g. in FIGS. 2 and 4—to both a top side 31a, and a bottom side of a respective circuit board 31 (whereby e.g. the packages 32a-32d might be mounted to the top side 31a of the printed circuit board 31, and e.g. the packages 32e, 32f (see dashed lines in FIG. 6) to the bottom side of the printed circuit board 31).

However—viewed from the top of the circuit board 31—there might be an overlap between respective outer limits of a package 32e mounted to the bottom side of the circuit board 31, and the outer limits of one or several corresponding packages (here: e.g. the packages 32a-32d) mounted to the top side 31 of the printed circuit board 31.

Advantageously, a corresponding package 32e on the bottom side of the board 31 might be placed essentially in a central area between several (e.g.: two, three, or—as shown here—four) adjacent packages 32a-32d on the top side 31a of the board 31 (and/or vice versa).

Hence, again, a better thermal profile might be achieved than in the art.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention, without departing from the scope and spirit of the invention as defined by the appended claims.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. An electronic system comprising:
   a first group of power-dissipating components mounted to a top side of a circuit board; and
   a second group of power-dissipating components mounted to a bottom side of said circuit board,
   wherein said first group of power-dissipating components are arranged in a first group of rows or columns, wherein a first distance between neighboring rows or columns in said first group of rows or columns is determined in accordance with a thermal behavior of each of said first group of power-dissipating components,
   wherein said second group of power-dissipating components are arranged in a second group of rows or columns, wherein a second distance between neighboring rows or columns in said second group of rows or columns is determined in accordance with a thermal behavior of each of said second group of power-dissipating components, and
   wherein a third distance between said first group of rows or columns and said second group of rows or columns is determined in accordance with said thermal behavior of each of said first group of power-dissipating components and said thermal behavior of each of said second group of power-dissipating components.

2. The electronic system of claim 1, wherein at least one of said first group of power-dissipating components or at least one of said second group of power-dissipating components includes a package containing an electronic device.

3. The electronic system of claim 2, wherein said electronic device is an integrated circuit.

4. The electronic system of claim 1, wherein all of said first group of power-dissipating components and said second group of power-dissipating components show a similar thermal behavior.

5. The electronic system of claim 4, wherein power dissipated via a bottom of at least one of said first group of power-dissipating components or at least one of said second group of power-dissipating components is lower than power dissipated via a top of said at least one first group of power-dissipating components or said at least one of said second group of power-dissipating components.

6. The electronic system of claim 4, wherein power dissipated via the top of said at least one first group of power-dissipating components or said at least one of said second group of power-dissipating components is lower than power dissipated via the bottom of said at least one first group of power-dissipating components or said at least one of said second group of power-dissipating components.

7. The electronic system of claim 1, wherein said first group of power-dissipating components or said second group of power-dissipating components includes at least four power-dissipating components.

8. The electronic system of claim 1, wherein said first group of rows or columns are offset with respect to said second group of rows or columns.

9. A method for mounting power-dissipating components onto a circuit board, comprising:
   (A) determining a thermal behavior of a first group of power-dissipating components;

(B) determining a first distance between neighboring rows or columns in a first group of rows or columns based upon said thermal behavior of said first group of power-dissipating components:

(C) determining a thermal behavior of a second group of power-dissipating components:

(D) determining a second distance between neighboring rows or columns in a second group of rows or columns based upon said thermal behavior of said second group of power-dissipating components:

(E) mounting said first group of power-dissipating components in said first group of rows or columns on a top side of a circuit board based upon said first distance and said second group of power-dissipating components in said second group of rows or columns on a bottom side of said circuit board based upon said second distance.

10. The method of claim 9, wherein at least one of said first group of power-dissipating components or at least one of said second group of power-dissipating components includes a package containing an electronic device.

11. The method of claim 10, wherein said electronic device is an integrated circuit.

12. The method of claim 9, wherein said step of determining of the thermal behavior of said power-dissipating components comprises:
determining power dissipated via the bottom of said power-dissipating components.

13. The method of claim 9, wherein step (A) comprises:
determining power dissipated via a top of each of said first group of power-dissipating components.

14. The method of claim 9, wherein step (E) comprises:
(E)(i) offsetting said first group of rows or columns mounted to said top side of said circuit board with respect to said second group of rows or columns mounted to said bottom side of said circuit board.

15. The method of claim 14, wherein step (E)(i) comprises:
offsetting said first group of rows or columns mounted to said top side of said circuit board with respect to said second group of rows or columns mounted to said bottom side of said circuit board based on said thermal behavior of said first group of power-dissipating components or said thermal behavior of said second group of power-dissipating components.

* * * * *

UNITED STATES PATENT AND TRADEMARK OFFICE
CERTIFICATE OF CORRECTION

| | | |
|---|---|---|
| PATENT NO. | : 7,443,025 B2 | Page 1 of 1 |
| APPLICATION NO. | : 11/146234 | |
| DATED | : October 28, 2008 | |
| INVENTOR(S) | : Rudi Verbist | |

It is certified that error appears in the above-identified patent and that said Letters Patent is hereby corrected as shown below:

Column 10
Line 7, please replace "system comprising:" with --system, comprising:--.

Signed and Sealed this

Twenty-third Day of December, 2008

JON W. DUDAS
*Director of the United States Patent and Trademark Office*